(12) United States Patent
Curtis, III

(10) Patent No.: US 11,791,601 B1
(45) Date of Patent: Oct. 17, 2023

(54) PULSED SOURCE FOR DRIVING NON-LINEAR CURRENT DEPENDENT LOADS

(71) Applicant: National Technology & Engineering Solutions of Sandia, LLC, Albuquerque, NM (US)

(72) Inventor: William C. Curtis, III, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 311 days.

(21) Appl. No.: 17/171,294

(22) Filed: Feb. 9, 2021

(51) Int. Cl.
| | | |
|---|---|---|
| *H01S 3/091* | (2006.01) | |
| *F42B 3/12* | (2006.01) | |
| *H05B 46/00* | (2020.01) | |
| *H01S 3/092* | (2006.01) | |
| *H05B 41/30* | (2006.01) | |
| *H01S 5/042* | (2006.01) | |

(52) U.S. Cl.
CPC ............ *H01S 3/0912* (2013.01); *F42B 3/124* (2013.01); *H01S 3/092* (2013.01); *H01S 5/042* (2013.01); *H05B 41/30* (2013.01); *H05B 46/00* (2020.01)

(58) Field of Classification Search
CPC ........ H01S 3/0912; H01S 3/092; H01S 5/042; F42B 3/124; H05B 46/00; H05B 41/30
See application file for complete search history.

(56) References Cited

U.S. PATENT DOCUMENTS

| | | | |
|---|---|---|---|
| 4,928,020 A | 5/1990 | Birx et al. | |
| 5,173,570 A * | 12/1992 | Braun | F42C 11/00 102/202.7 |
| 5,191,261 A * | 3/1993 | Mass | H05B 41/34 315/176 |
| 5,196,766 A * | 3/1993 | Beggs | H05B 41/34 315/200 A |
| 5,726,869 A | 3/1998 | Yamashita et al. | |
| 6,847,196 B2 | 1/2005 | Garabandic | |
| 6,888,319 B2 * | 5/2005 | Inochkin | H05B 41/30 315/243 |
| 7,173,835 B1 | 2/2007 | Yang | |
| 2007/0035256 A1* | 2/2007 | Baksht | H05B 41/34 315/209 CD |

(Continued)

*Primary Examiner* — Xinning(Tom) Niu
(74) *Attorney, Agent, or Firm* — Samantha Updegraff; Calfee, Halter & Griswold LLP

(57) ABSTRACT

A pulsed current source comprises a power source, a discharge capacitor, and an inductive element. The discharge capacitor is selectively coupled to either of the power source or the inductive element. When coupled to the power source, the discharge capacitor is charged. The inductive element can be connected to a load. The load can have a current-dependent impedance. When the discharge capacitor is coupled to the inductive element, the discharge capacitor discharges through the inductive element and the load. The discharge capacitor and the inductive element are configured so that the current through the load exhibits a substantially linear rise in a linear operational region. The inductive element is configured to saturate during discharge of the capacitor through the load, so that the saturation of the inductive element causes the current through the load to continue to rise in a substantially linear fashion.

20 Claims, 5 Drawing Sheets

(56) References Cited

U.S. PATENT DOCUMENTS

| | | | |
|---|---|---|---|
| 2010/0001805 A1* | 1/2010 | Ishii | H03B 5/1841 |
| | | | 331/117 R |
| 2013/0032806 A1* | 2/2013 | Kimura | G09G 3/3275 |
| | | | 257/71 |
| 2016/0149370 A1* | 5/2016 | Marincek | A61B 18/203 |
| | | | 606/7 |

* cited by examiner

PULSED SOURCE FOR DRIVING NON-LINEAR CURRENT DEPENDENT LOADS

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

A high-inertia current source can be used to provide a large amount of current to a current-dependent load in a short period of time. Under certain operating conditions, some current-dependent loads (e.g., bridge wire detonators and flash lamps) have a resistance that changes by several orders of magnitude over a time span of less than 100 nanoseconds. For instance, as a current in a bridge wire detonator increases, the resistance of that detonator increases. Conventionally, a high-inertia current source for powering a current-dependent load consists of a power source selectively coupled to a discharge capacitor that is in parallel with the current-dependent load. While a capacitor discharge circuit can provide a very brief high-inertia current pulse, a rate of rise of the current delivered to the load can slow and reverse within nanoseconds. In some applications, this slowdown and reversal of current delivered to the load can reduce reliability of a system. For instance, reliability of an explosives detonation system can depend on control of timing of a detonation event to within tens of nanoseconds (e.g., within 50 nanoseconds or less of a target detonation time). The conventional high-inertia current source can be insufficient to provide the necessary timing certainty in such applications due to the slowdown of current rise through a bridge wire detonator.

SUMMARY

The following is a brief summary of subject matter that is described in greater detail herein. This summary is not intended to be limiting as to the scope of the claims.

Technologies pertaining to a high-inertia current source are described herein. An exemplary high-inertia current source comprises a power source, an inductive element, and a discharge capacitor. The power source is selectively coupled to the discharge capacitor by way of a charging switch, such that when the charging switch is closed, the discharge capacitor is charged by the power source. The discharge capacitor is connected to a discharge switch such that, when the discharge switch is closed, the discharge capacitor is connected in series with the inductive element. In exemplary embodiments, the charging switch and the discharge switch can be configured such that only one of the charging switch and the discharge switch is closed at a time. The inductive element is connected to a first terminal of a current-dependent load (e.g., a bridge wire detonator, flash lamps, gas/vacuum switches, etc.). A second terminal of the current-dependent load is connected to the discharge capacitor (e.g., by way of a common ground).

When the charging switch is closed, the discharge capacitor is charged by the power source. During charging of the capacitor, the discharge switch can be kept open, such that no current is discharged through the load. When the discharge capacitor has been sufficiently charged (e.g., to a threshold capacitor voltage), the charging switch is opened and the discharge switch is closed. When the discharge switch is closed, the discharge capacitor discharges current through the inductive element and the load. The load current exhibits an exponential increase during an exponential operational period. Subsequent to the exponential operational period, the load current exhibits a substantially linear increase during a linear operational period of the current source. The inductive element is configured to saturate during the linear operational period. When the inductive element saturates, the magnetic field established by the inductive element collapses, inductance of the inductive element falls, and current through the inductor rises. Upon saturation of the inductive element, the load current continues to rise in a substantially linear fashion throughout the linear operational period of the current source. Eventually, as the capacitor is discharged, the rate of rise of the load current will begin to decrease, beginning a sinusoidal operational period of the current source. The current source can be configured to reach a target peak current, or to discharge at least a threshold amount of charge through the load in a target period of time.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
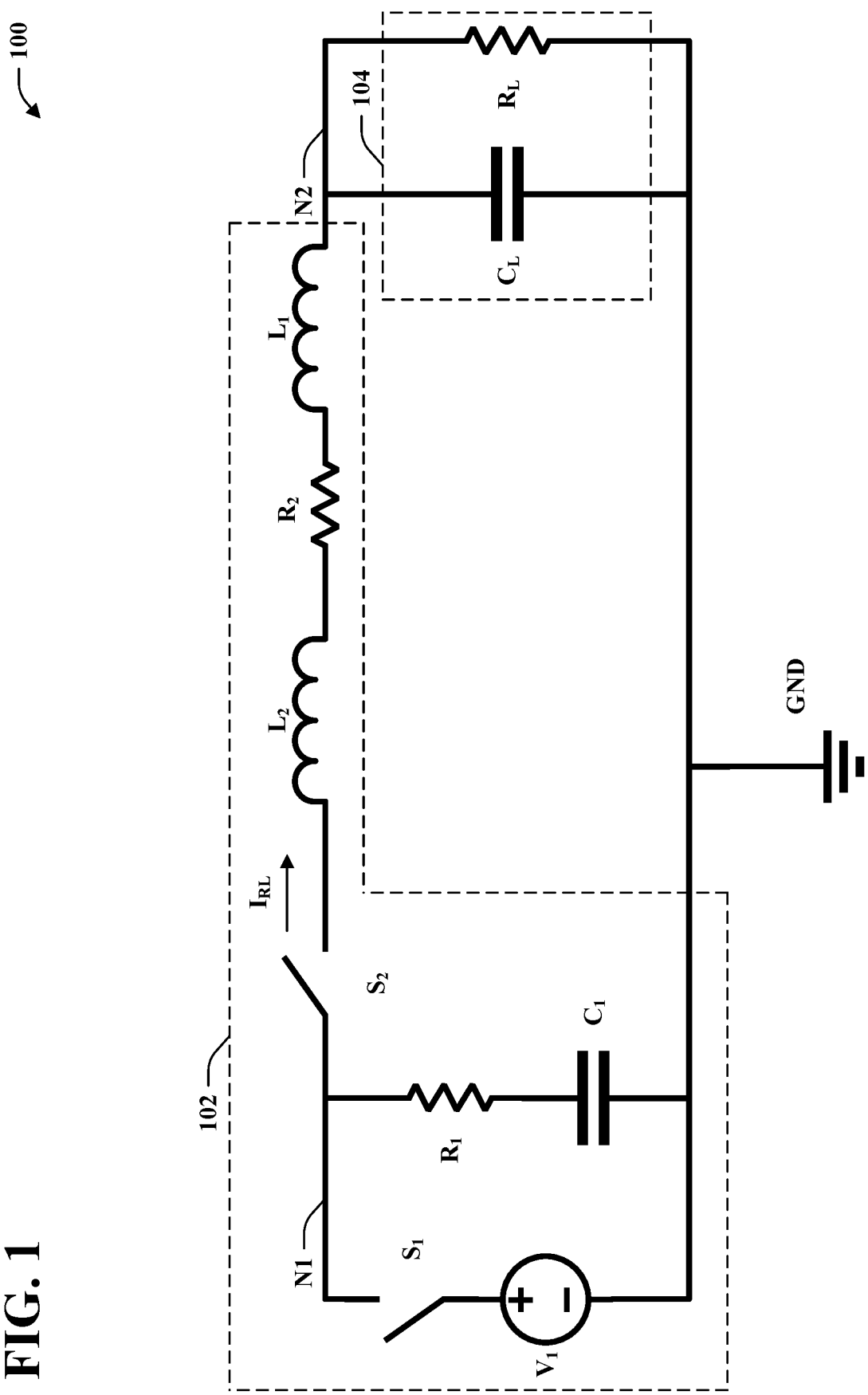
FIG. 1 is a circuit schematic of an exemplary high-inertia current source.

Various technologies pertaining to a high-inertia current source are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

With reference to FIG. 1, an exemplary system 100 that incorporates a high-inertia current source 102 is illustrated. The system 100 includes the high-inertia current source 102 and a current-dependent load 104. The current-dependent load 104 is modeled as a resistor $R_L$ with a parasitic load capacitance $C_L$. The high-inertia current source 102 includes a voltage source $V_1$, a charging switch $S_1$, a discharge capacitor $C_1$, a discharge switch $S_2$, and a saturable inductor $L_1$. The high-inertia current source 102 shown in FIG. 1 further includes modeled line resistances $R_1$ and $R_2$, and a modeled line inductance $L_2$. It is to be understood that while modeled elements $R_1$, $R_2$, $C_L$ and $L_2$ affect performance of the circuit 100, these elements are not discrete components but rather represent electrical effects of other components, such as the discharge capacitor $C_1$, the saturable inductor $L_1$, the current-dependent load 104, and various interconnects among such components.

The voltage source $V_1$ is connected to ground and to a first node $N_1$ by way of the charging switch $S_1$. The discharge capacitor $C_1$ and its associated line resistance $R_1$ are connected in series between ground and the first node N1. The discharge switch $S_2$ is connected between the first node N1 and the series combination of the line inductance $L_2$ and resistance $R_2$. It is to be understood that while the switches $S_1$ and $S_2$ are modeled as single-pole single-throw (SPST) switches, the switches $S_1$ and $S_2$ can instead be a single-pole double-throw (SPDT) switch that selectively connects the discharge capacitor $C_1$ to either the saturable inductor $L_1$ (through line impedances $L_2$ and $R_2$) or to the voltage source $V_1$. The series combination of line impedances $L_2$, $R_2$ and the saturable inductor $L_1$ are connected between the discharge switch $S_2$ and a second node N2. The current-dependent load 104 is connected between ground and the second node N2.

When the charging switch $S_1$ is closed, the voltage source $V_1$ charges the discharge capacitor $C_1$. When the discharge capacitor $C_1$ is sufficiently charged (e.g., to a set point voltage, to the output voltage of the voltage source $V_1$, or after a set charging time has elapsed), the charging switch $S_1$ can be opened, and the discharge capacitor $C_1$ ceases charging. It is to be understood that in other embodiments, the voltage source $V_1$ can be replaced by any suitable power source that is capable of charging a capacitor (e.g., a current source).

Subsequent to the discharge capacitor $C_1$ being charged by the voltage source $V_1$, and the charging switch $S_1$ being opened, the discharge switch $S_2$ is closed. Closing of the discharge switch $S_2$ causes the discharge capacitor $C_1$ to discharge current to the current-dependent load 104. The discharge capacitor $C_1$ discharges current through the saturable inductor $L_1$ and to the current-dependent load 104. The current-dependent load 104 has an impedance that is a function of the current $I_{RL}$ delivered to the load 104. The high-inertia current source 102 is configured so that the current $I_{RL}$ delivered to the load 104 has a substantially linear increase during a linear operational period despite the change in impedance of the current-dependent load 104.

Figure 2:
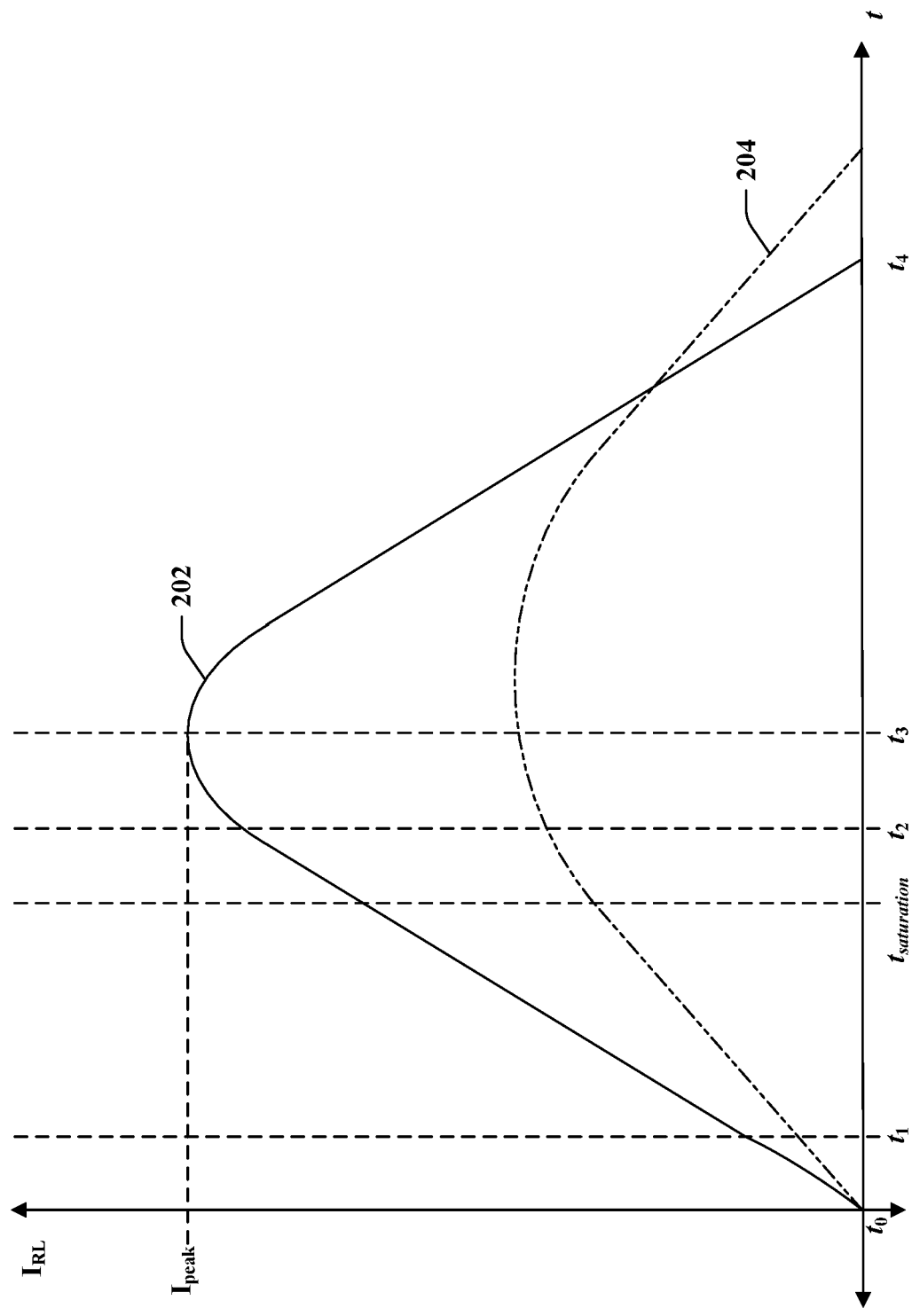
FIG. 2 depicts exemplary plots of load current over time for the circuit depicted in FIG. 1 and a modified current source.

Referring now to FIG. 2, a plot 202 of the load current $I_{RL}$ of the system 100 against time is shown. At time $t_0$, the discharge switch $S_2$ is closed, and the discharge capacitor $C_1$ begins discharging through the saturable inductor $L_1$ and the current-dependent load 104. From time $t_0$ to time $t_1$, the high-inertia current source 102 operates in an exponential regime wherein the load current $I_{RL}$ can be modeled as an exponential function $I_{RL}(t)=X^Z$ where Z is the impedance of the current-dependent load 104. Z changes over time in response to the changing load current $I_{RL}$. Depending on the particular construction of the current-dependent load 104, the change in impedance of the load 104 can vary in a linear or a non-linear fashion.

In exemplary embodiments, the high-inertia current source 102 is configured to deliver a substantially linearly increasing load current $I_{RL}$ in a linear operational period by selection of the discharge capacitor $C_1$ and the saturable inductor $L_1$. For example, from time $t_1$ to time $t_2$, the load current $I_{RL}$ can be modeled as a linear function of time, $I_{RL}(t)=mt+b$. The high-inertia current source 102 is referred to as "high-inertia" because the current source 102 provides the linearly increasing load current $I_{RL}$ in the linear operation period $t_1 \rightarrow t_2$ in spite of the impedance of the load 104 changing in a potentially nonlinear fashion. The high-inertia current source 102 inherently provides a linear output load current $I_{RL}$ in the linear operation period without need for further control circuitry apart from the discharge switch $S_2$, which is kept closed throughout operation of the current source 102. The high-inertia current source 102 therefore provides an output load current profile (e.g., $I_{RL}(t)$) that is not readily reproducible by switched capacitor networks.

Subsequent to time $t_2$, the output load current $I_{RL}(t)$ can be modeled as a sinusoid $I_{RL}(t)=A\sin(\omega t \pm \theta)$. Thus, after time $t_2$ the rate of increase of the load current $I_{RL}(t)$ falls and eventually turns negative after the load current $I_{RL}(t)$ peaks at time $t_3$. In various embodiments, the system 100 is configured such that the current-dependent load 104 has performed an intended functionality prior to the fall-off of the load current $I_{RL}(t)$ after time $t_2$. The time period $t_0 \rightarrow t_2$ can therefore be referred to as a discharge time of the system 100. In some embodiments, the time $t_2 \rightarrow t_0$ can be less than or equal to about 500 nanoseconds, less than or equal to about 300 nanoseconds, or less than or equal to about 150 nanoseconds.

The discharge capacitor $C_1$ and the saturable inductor $L_1$ are configured such that the saturable inductor $L_1$ is saturated by the load current $I_{RL}$ during discharge of the capacitor $C_1$. When the saturable inductor $L_1$ saturates, the magnetic field established in the core of the inductor $L_1$ collapses. Collapse of the magnetic field causes the inductance of the saturable inductor $L_1$ to fall. In exemplary embodiments, saturation of the inductor $L_1$ causes inductance of the inductor $L_1$ to drop to 25% or less of its nominal value. The collapse of the magnetic field causes the current through the inductor $L_1$ to increase. This increase of the current through the inductor $L_1$ offsets a slowdown in the rate of rise of the current $I_{RL}(t)$ that would otherwise be delivered by the discharge capacitor $C_1$.

By way of example, and referring once again to FIG. 2, a second plot 204 of load current $I_{RL}$ for the system 100 with the saturable inductor $L_1$ shorted is also shown. Stated differently, the second plot 204 shows the load current $I_{RL}$ for a circuit that includes the discharge capacitor $C_1$ but not the saturable inductor $L_1$, such that the discharge capacitor $C_1$ discharges directly to the current-dependent load 104. The saturable inductor $L_1$ can be configured to saturate at an operational point at which the high-inertia current source 102 would otherwise experience a slowdown in the rate of current rise. For instance, the saturable inductor $L_1$ can be configured to saturate at a time $t_{saturation}$ that is within the linear operational period $t_1 \rightarrow t_2$ of the system 100. In exemplary embodiments, $t_{saturation}$ can be less than or equal to about 100 nanoseconds after $t_0$ (a time at which the discharge switch $S_2$ is closed). The plot 204 shows that without the saturable inductor $L_1$, the load current $I_{RL}$ delivered by the current source 102 would exhibit a slowing rate of rise at the time $t_{saturation}$. The saturable inductor $L_1$ is configured to saturate at the time $t_{saturation}$ to offset the slowing rate of rise of the load current $I_{RL}$. Thus, from the time $t_{saturation}$ to the time $t_2$, the plot 202 of the load current delivered by the high-inertia current source 102 shows that the current source 102 continues to operate in the linear operation region. By contrast, the plot 204 shows that the load current $I_{RL}$ delivered by a current source without the saturable inductor $L_1$ enters sinusoidal operational region.

It is to be understood that while the time at which the saturable inductor $L_1$ saturates, $t_{saturation}$, is described herein as being a same time at which a current source without the saturable inductor $L_1$ would exhibit a drop-off in current rise, the saturable inductor $L_1$ can instead be configured to saturate prior to a time at which the load current $I_{RL}$ would drop off in the current source without the saturable inductor $L_1$. This can account for any time constants due to other parameters of the circuit that may delay the effect of saturation of the inductor $L_1$ on the load current $I_{RL}$.

As indicated by the plots 202, 204, the rate of rise of the load current $I_{RL}(t)$ and the peak current $I_{peak}$ are greater for the high-inertia current source 102 than a current source that does not include the saturable inductor $L_1$. Whether or not a pulse width (e.g., $t_4$-$t_0$) of the load current $I_{RL}(t)$ delivered by the high-inertia current source is wider or narrower than the load current delivered by a current source that does not include the saturable inductor will depend on various parameters of the system 100, such as line impedances.

Design parameters of the saturable inductor $L_1$ such as core geometry and core material can be selected such that the saturable inductor $L_1$ saturates at an intended operational point (e.g., a specified discharge time elapsed, or a specified current $I_{RL}$). In exemplary embodiments, the saturable inductor $L_1$ is configured such that the inductor $L_1$ is capable of handling a pre-defined peak current (e.g., $I_{peak}$) of the system 100, and further so that the inductor $L_1$ saturates in the linear operation period $t_1 \rightarrow t_2$.

Specific component values of the voltage source $V_1$, the capacitor $C_1$, and the saturable inductor $L_1$ can be selected based upon a desired profile of the load current $I_{RL}$. For example, it may be desirable to operate some loads with low voltage (e.g., less than 20 V) and/or low current (e.g., less than 1 A). In such embodiments, the voltage of the voltage source $V_1$ can be less than or equal to about 20 V. In other embodiments, it may be desirable to operate the load 104 at high voltage (e.g., greater than 100 V) and/or high current (e.g., greater than 1000 A). In such embodiments, the voltage of the voltage source $V_1$ can be greater than or equal to about 200 V, greater than or equal to about 500 V, or greater than or equal to about 1000 V. In various exemplary embodiments, the capacitance of the discharge capacitor $C_1$ can be between 0.01 µF and 10 µF. In further embodiments, the inductance of the saturable inductor $L_1$ can be less than or equal to about 1 mH, 500 nH, or 100 nH. In some embodiments, the saturable inductor $L_1$ is configured as a strip line inductor, in order to yield a sufficiently low inductance to permit saturation of the inductor $L_1$. A peak current (e.g., $I_{peak}$) delivered by the high-inertia current source 102 can be greater than or equal to about 750 A, greater than or equal to about 1000 A, or greater than or equal to about 1500 A.

It is to be understood that the current through the load, $I_{RL}$, will be a function of line resistances $R_1$ and $R_2$, line inductance $L_2$, and the parasitic capacitance of the load $C_L$. However, the discharge capacitor $C_1$, the saturable inductor $L_1$, the discharge switch $S_2$, and interconnects among these components can be selected such that $I_{RL}$ is primarily determined by the impedance characteristic of the resistance of the load $R_L$, the discharge capacitor $C_1$, the saturable inductor $L_1$, and the charged voltage across the discharge capacitor $C_1$ (i.e., prior to the discharge switch $S_2$ being closed).

Figure 3:
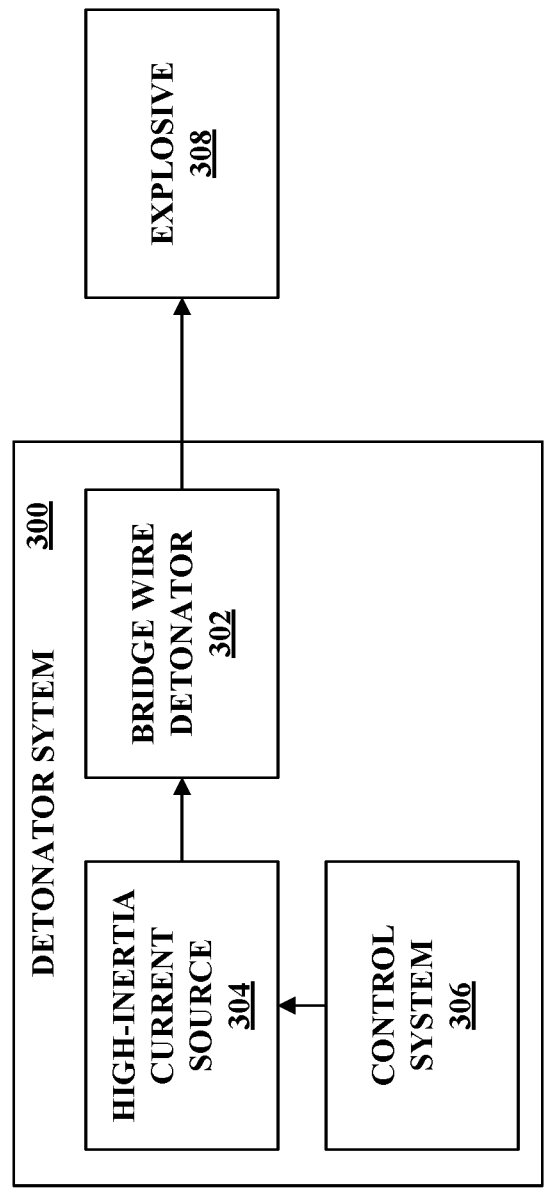
FIG. 3 is a functional block diagram of an exemplary detonator system that incorporates a high-inertia current source.

In exemplary embodiments, the current-dependent load 104 can be or include a bridge wire detonator. By way of example, and referring now to FIG. 3, an exemplary detonator system 300 that includes a bridge wire detonator 302, a high-inertia current source 304, and a control system 306 is shown. In exemplary embodiments, the high-inertia current source 304 can be or include the high-inertia current source 102. The bridge wire detonator 302 is configured such that, when a high-current, short-duration pulse is provided to the detonator 302, the detonator 302 explodes. Explosion of the detonator 302 can be used to initiate another explosive event by detonating a primary explosive 308. The bridge wire detonator 302 can be connected to the high-inertia current source 304 in a similar manner as the current-dependent load 104 shown in FIG. 1. The control system 306 can be configured to control operation of the high-inertia current source 304. By way of example, the control system 306 can be configured to operate a charging switch and a discharge switch (e.g., the switches $S_1$, $S_2$) included in the high-inertia current source 304.

Figure 4:
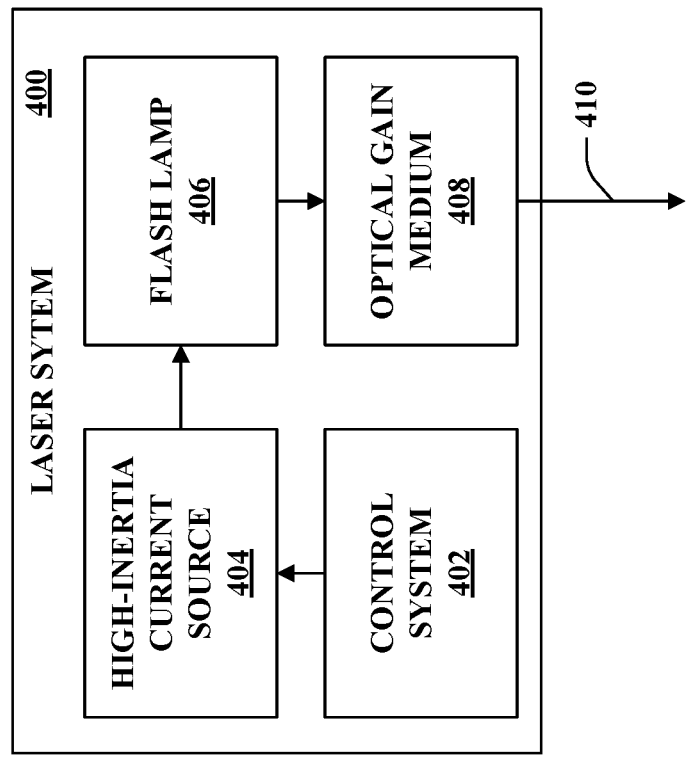
FIG. 4 is a functional block diagram of an exemplary laser system that incorporates a high-inertia current source.

In further exemplary embodiments, the current-dependent load 104 can be or include a flash lamp. By way of example, and referring now to FIG. 4, an exemplary laser system 400 is illustrated. The laser system 400 includes a control system 402, a high-inertia current source 404, a flash lamp 406, and an optical gain medium 408. The control system 402 controls the high-inertia current source 404 (e.g., configurable as the high-inertia current source 102) to provide a current pulse to the flash lamp 406. The current pulse causes the flash lamp 406 to output a high-intensity optical signal to the optical gain medium 408, pumping the optical gain medium 408. The high-intensity optical signal can be configured to cause population inversion in the optical gain medium 408 such that a laser beam 410 is output by the optical gain medium 408. The high-inertia current source 404 can be configured to have a high peak current (e.g., greater than 1000 A) and a short discharge duration (e.g., less than or equal to 150 nanoseconds), facilitating a high output pulse rate of the laser system 400.

Figure 5:
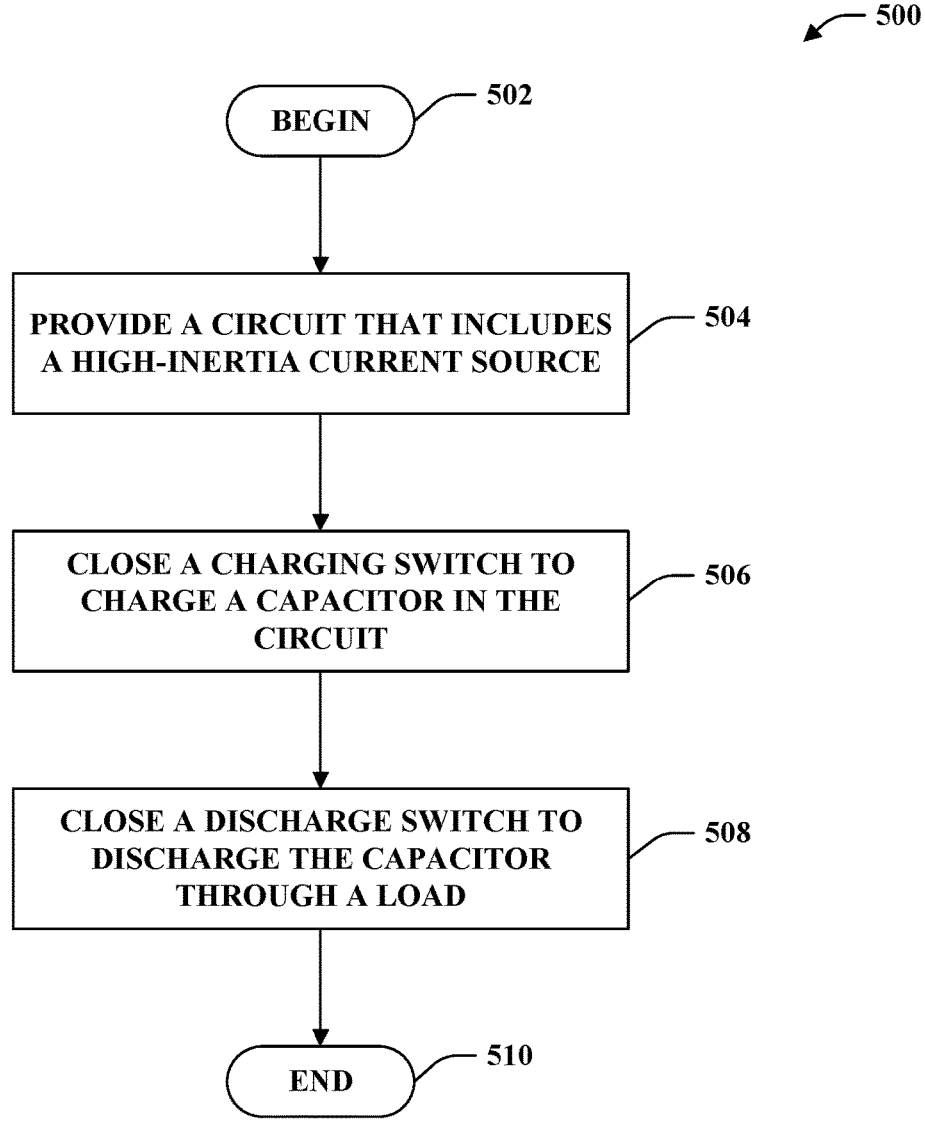
FIG. 5 is a flow diagram that illustrates an exemplary methodology for making and operating a high-inertia current source.

FIG. 5 illustrates an exemplary methodology relating to providing and operating a high-inertia current source. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Moreover, the acts described herein may be or be facilitated by computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Referring now to FIG. 5, a methodology 500 that facilitates providing and operating a high-inertia current source is illustrated. The methodology 500 begins at 502, and at 504, a circuit that includes a high-inertia current source is provided. In exemplary embodiments, at 504, the system 100 can be provided. In other words, at 504, a high-inertia current source circuit is provided, wherein the circuit comprises a power source, a capacitor, a charging switch that selectively couples the power source and the capacitor, a load, a saturable inductive element connected to the load, and a discharge switch that selectively couples the capacitor to the saturable inductive element. At 506, the charging switch is closed to charge the capacitor. At 508, the discharge switch is closed (e.g., subsequent to the charging switch being opened), causing the capacitor to discharge through the saturable inductor and the load. Discharging of the capacitor causes a current through the load to exhibit a substantially linear rise in a linear operational period of the circuit. During discharge of the capacitor in the linear operational period, the saturable inductor saturates, causing the load current to continue to rise in a linear fashion. Inclusion of the saturable inductor in the circuit provided at 504 allows the circuit to continue to exhibit a linear rise in load current after a time at which a current source that did not include the saturable inductor would exhibit a drop-off in the rate of rise of the load current. The methodology 500 ends at 510.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A circuit, comprising:
   a load, wherein the load has an impedance that rises as an amount of current delivered to the load rises:
   an inductive element connected in series with the load;
   a capacitor; and
   a discharge switch connected between the capacitor and the inductive element, wherein responsive to the discharge switch closing, the capacitor discharges a current that passes through the load, the inductive element and the capacitor configured such that the current causes the inductive element to saturate, wherein responsive to saturating, the inductive element causes the current through the load to linearly increase.

2. The circuit of claim 1, wherein the load is a detonator.

3. The circuit of claim 1, wherein the load is a flash lamp.

4. The circuit of claim 3, wherein the flash lamp is configured to optically pump a pulsed laser source.

5. The circuit of claim 1, wherein the inductive element has an inductance of less than or equal to 1 milli-Henry.

6. The circuit of claim 5, wherein the inductive element has an inductance of less than or equal to 100 nano-Henries.

7. The circuit of claim 1, wherein the discharge capacitor has a capacitance of between 0.01 micro-Farads and 10 micro-Farads.

8. The circuit of claim 1, wherein the inductive element is a strip line inductive element.

9. The circuit of claim 1, wherein the inductive element saturates within 100 nanoseconds of the discharge switch being closed.

10. The circuit of claim 1, further comprising a power source, wherein the power source is selectively coupled to the capacitor and configured to charge the capacitor when coupled to the capacitor.

11. The circuit of claim 10, wherein the discharge switch is further connected between the capacitor and the power source, wherein when the discharge switch is closed in a first position the capacitor discharges the current, and when the discharge switch is closed in a second position the power source charges the capacitor.

12. The circuit of claim 10, further comprising a charging switch connected between the capacitor and the power source, such that when the charging switch is closed, the power source charges the capacitor.

13. The circuit of claim 12, wherein the charging switch and the discharge switch are configured such that only one of the charging switch or the discharge switch is closed at a time.

14. The circuit of claim 1, wherein the current through the load has a peak of greater than or equal to 1500 amperes.

15. The circuit of claim 1, wherein a discharge time of the circuit is less than or equal to 500 nanoseconds.

16. A method, comprising:
    providing a circuit that comprises:
       a power source;
       a capacitor;
       a charging switch;
       a load that has an impedance that is based upon an amount of current delivered to the load such that as the amount of the current that is delivered to the load rises, the impedance of the load rises;
       an inductive element connected in series with the load; and
       a discharge switch connected between the capacitor and the inductive element;
    closing the charging switch such that the power source charges the capacitor; and
    closing the discharge switch such that the capacitor discharges current through the inductive element to the load, wherein discharge of the current through the inductive element causes the inductive element to saturate, and further wherein the amount of current delivered to the load linearly increases for a time window subsequent to the inductive element becoming saturated.

17. The method of claim 16, wherein the load is a flash lamp that is configured to pump an optical gain medium.

18. The method of claim 16, wherein the load is a bridge wire detonator.

19. A detonation system, comprising:
   a detonator, wherein the detonator has an impedance that increases as an amount of current delivered to the detonator increases;
   an inductive element connected to the detonator;
   a capacitor; and
   a discharge switch connected between the capacitor and the inductive element, wherein responsive to the discharge switch closing, the capacitor discharges a current that passes through the inductive element and is provided to the detonator, the inductive element and the capacitor configured such that the current causes the inductive element to saturate, wherein responsive to saturating, the inductive element causes the current through the detonator to linearly increase.

20. The detonation system of claim 19, wherein the current through the detonator linearly increases prior to the current causing the inductive element to saturate, and further wherein the current through the detonator continues to linearly increase after the current causes the inductive element to saturate due to the inductive element becoming saturated.

* * * * *